(12) United States Patent
Fu et al.

(10) Patent No.: US 9,768,108 B2
(45) Date of Patent: Sep. 19, 2017

(54) CONDUCTIVE POST PROTECTION FOR INTEGRATED CIRCUIT PACKAGES

(71) Applicant: QUALCOMM Incorporated, San Diego, CA (US)

(72) Inventors: Jie Fu, San Diego, CA (US); Chin-Kwan Kim, San Diego, CA (US); Manuel Aldrete, Encinitas, CA (US); Milind Pravin Shah, San Diego, CA (US); Dwayne Richard Shirley, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/859,318

(22) Filed: Sep. 20, 2015

(65) Prior Publication Data

US 2016/0247754 A1     Aug. 25, 2016

Related U.S. Application Data

(60) Provisional application No. 62/118,886, filed on Feb. 20, 2015.

(51) Int. Cl.
*H01L 23/02*     (2006.01)
*H01L 23/498*     (2006.01)
(Continued)

(52) U.S. Cl.
CPC ...... *H01L 23/49894* (2013.01); *H01L 21/486* (2013.01); *H01L 21/4846* (2013.01); *H01L 23/49827* (2013.01); *H01L 23/49838* (2013.01); *H01L 23/49866* (2013.01); *H01L 23/5389* (2013.01); *H01L 25/105* (2013.01); *H01L 23/49816* (2013.01); *H01L 23/49833* (2013.01);

(Continued)

(58) Field of Classification Search
CPC ......... H01L 23/49816; H01L 23/49838; H01L 23/49866; H01L 23/49894; H01L 21/4846; H01L 21/486; H01L 23/49827; H01L 2924/1533; H01L 2224/16227; H01L 2224/32225; H01L 2224/73204
USPC ........ 257/686, 774, 773, 777, 787; 438/109, 438/629, 637
See application file for complete search history.

(56) References Cited

U.S. PATENT DOCUMENTS 7,632,708 B2    12/2009    Haba et al.
8,946,901 B2    2/2015    Zohni et al.
(Continued)

OTHER PUBLICATIONS

International Search Report and Written Opinion—PCT/US2016/018504 ISA/EPO—dated Apr. 25, 2016.

*Primary Examiner* — Thinh T Nguyen
(74) *Attorney, Agent, or Firm* — Muncy, Geissler, Olds & Lowe, P.C./QUALCOMM

(57) ABSTRACT

An integrated circuit package includes a substrate/interposer assembly having a plurality of conductive contacts and a plurality of conductive posts, such as copper posts, electrically coupled to at least some of the conductive contacts in the substrate/interposer assembly. The conductive posts are surrounded by a protective dielectric, such as a photoimageable dielectric (PID). An integrated circuit die may be disposed on the substrate/interposer assembly within an interior space surrounded by the dielectric. An additional integrated circuit die may be provided in a package-on-package (POP) configuration.

26 Claims, 9 Drawing Sheets

(51) Int. Cl.
*H01L 21/48* (2006.01)
*H01L 23/538* (2006.01)
*H01L 25/10* (2006.01)

(52) U.S. Cl.
CPC ........... *H01L 2224/16227* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2924/1533* (2013.01); *H01L 2924/15311* (2013.01)

(56) References Cited

U.S. PATENT DOCUMENTS

| | | | |
|---|---|---|---|
| 8,951,845 B2 | 2/2015 | Sakuma et al. | |
| 2001/0012643 A1* | 8/2001 | Asada | H01L 21/563 438/107 |
| 2011/0147911 A1* | 6/2011 | Kohl | H01L 23/49827 257/686 |
| 2012/0193789 A1 | 8/2012 | Hu et al. | |
| 2013/0009319 A1 | 1/2013 | Shao et al. | |
| 2013/0299986 A1 | 11/2013 | Sun et al. | |
| 2014/0183731 A1 | 7/2014 | Lin et al. | |
| 2014/0210101 A1 | 7/2014 | Lin et al. | |
| 2015/0043190 A1 | 2/2015 | Mohammed et al. | |

\* cited by examiner

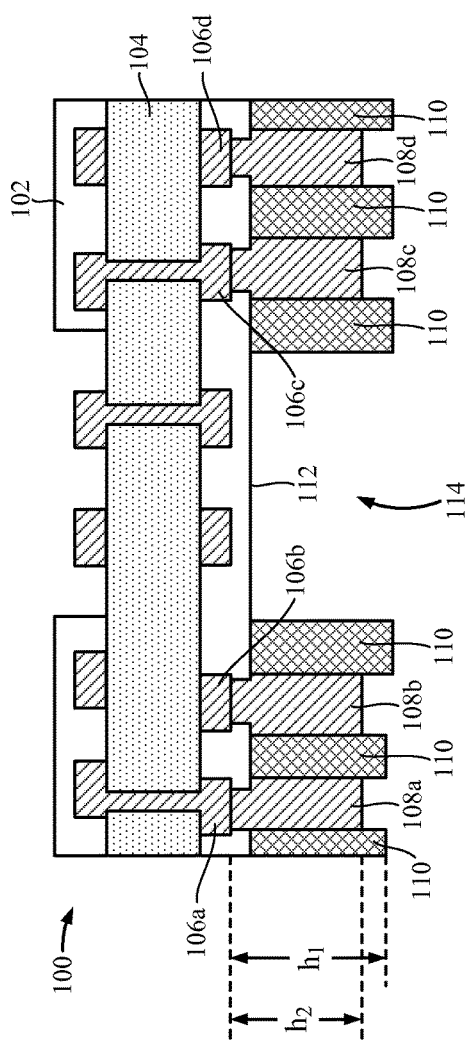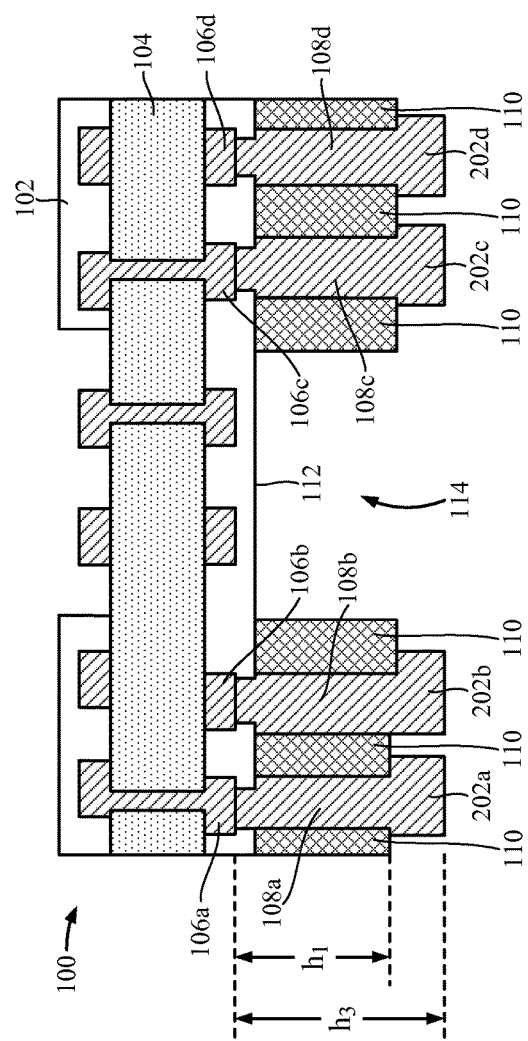

CONDUCTIVE POST PROTECTION FOR INTEGRATED CIRCUIT PACKAGES

CLAIM OF PRIORITY UNDER 35 U.S.C. §119

The present Application for Patent claims priority to Provisional Application No. 62/118,886, entitled "COPPER POST PROTECTION FOR INTEGRATED CIRCUIT PACKAGES," filed Feb. 20, 2015, and assigned to the assignee hereof and hereby expressly incorporated by reference herein.

FIELD OF DISCLOSURE

Various examples described herein relate to integrated circuit packages, and more particularly, to conductive post protection for integrated circuit packages.

BACKGROUND

In a conventional integrated circuit package, such as a conventional flip chip package, a plurality of conductive posts may be provided between top and bottom substrates or interposers. An integrated circuit die, for example, a flip chip die, may be attached to one of the substrates or interposers, for example, the bottom substrate or interposer, and positioned between the two substrates or interposers. A plurality of conductive posts are provided between the top and bottom substrates or interposers to provide mechanical support as well as electrical connections for the integrated circuit package. These conductive posts may be copper posts for good electrical conductivity. Each of the top and bottom substrates or interposers may include a plurality of conductive contacts, and the conductive posts may be coupled between some of the conductive contacts in the bottom substrate or interposer and some of the conductive contacts in the top substrate or interposer.

In a conventional process for making such an integrated circuit package, the conductive posts, such as copper posts, are provided directly on respective conductive contacts in one of the substrates or interposers, for example, the top substrate or interposer. A plurality of solder balls may be provided on respective conductive contacts in the other substrate or interposer, for example, the bottom substrate or interposer. The copper posts, which are attached to the respective conductive contacts in the top substrate or interposer, are soldered to respective conductive contacts in the bottom substrate or interposer with respective solder balls. After the top and bottom substrates or interposers with copper posts are assembled to form an integrated circuit package, which may sit on the bottom substrate or interposer, the only mechanical support for the top substrate or interposer may be provided by the copper posts.

In such a conventional integrated circuit package, the copper posts may have a tendency of cracking or breaking in the manufacturing of the top substrate or interposer to which the copper posts are attached. Such a tendency for cracking or breaking of copper posts may results in a low yield in the manufacturing of the copper post substrate, low yield in the assembly of copper post package and a high risk of reliability test failure, thereby increasing the cost of manufacturing. Various schemes have been devised in attempts to increase the manufacturing yield for the copper posts and to decrease the risk of reliability test failure. One such scheme is to provide a mold or epoxy flux that fills the entire interior space between the top and bottom substrates or interposers of the integrated circuit package to protect the copper posts. However, such a scheme may involve an expensive manufacturing process and still may not improve the yield for copper substrate manufacturing.

SUMMARY

Examples of the disclosure are directed to integrated circuit devices and methods of making the same. Integrated circuit devices and methods according to examples of the disclosure are expected to increase yields for the manufacturing of the conductive post substrate as well as for the assembly of the conductive post package. Moreover, tighter interposer pitches, and in package-on-package (POP) configurations, tighter POP pitches, may be achieved with devices and methods according to examples of the disclosure, thereby allowing the overall package size to be decreased.

In one example, a device is provided, the device comprising: a first substrate comprising first and second surfaces; a plurality of conductive contacts on the first surface of the first substrate; a dielectric on the first surface of the first substrate and having a plurality of openings; and a plurality of conductive posts coupled to at least some of the conductive contacts, the dielectric at least partially surrounding the plurality of conductive posts.

In another example, an integrated circuit package is provided, the package comprising: a first substrate having first and second surfaces; a first plurality of conductive contacts on the first surface of the first substrate; a second substrate having first and second surfaces; a second plurality of conductive contacts on the first surface of the second substrate; a dielectric disposed between the first surface of the first substrate and the first surface of the second substrate, the dielectric having a plurality of openings; a plurality of conductive posts disposed within some but not all of the openings in the dielectric, the conductive posts electrically coupled to at least some of the first plurality of conductive contacts on the first surface of the first substrate and at least some of the second plurality of conductive contacts on the first surface of the second substrate; and an integrated circuit die disposed on the first surface of the second substrate within one of the openings of the dielectric not occupied by one of the conductive posts.

In yet another example, a method of making a device is provided, the method comprising: providing a substrate having first and second surfaces; forming a plurality of conductive contacts at least on the first surface of the substrate; forming a dielectric on the first surface of the substrate; forming a plurality of openings in the dielectric; and forming a plurality of conductive posts within some but not all of the openings in the dielectric.

BRIEF DESCRIPTION OF THE DRAWINGS

The accompanying drawings are presented to aid in the description of examples of the disclosure and are provided solely for illustration of the examples and not limitation thereof.

FIG. 1 is a cross-sectional view illustrating an example of a substrate/interposer assembly with conductive posts protected by a dielectric.

FIG. 2 is a cross-sectional view illustrating another example of a substrate/interposer assembly with conductive pads added to the conductive posts.

DETAILED DESCRIPTION

Figure 3:
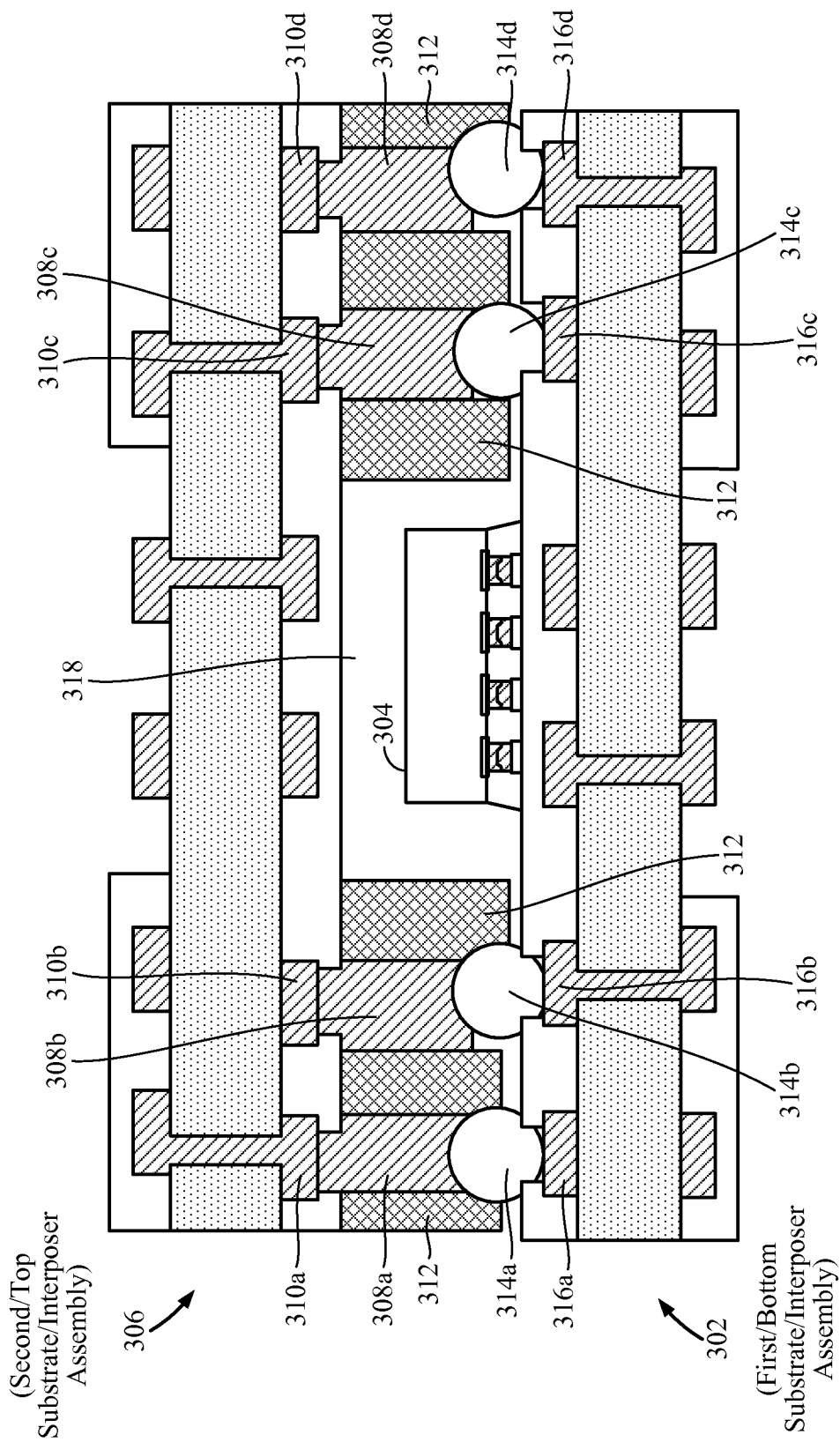
FIG. 3 is a cross-sectional view illustrating an example of an integrated circuit package with conductive posts protected by a dielectric.

Aspects of the disclosure are described in the following description and related drawings directed to specific examples. Alternate examples may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any example described herein as "exemplary" is not necessarily to be construed as preferred or advantageous over other examples. Likewise, the term "examples" does not require that all examples include the discussed feature, advantage or mode of operation.

The terminology used herein is for the purpose of describing particular examples and is not intended to be limiting of the examples. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "I" between two adjacent words has the same meaning as "or" unless expressly stated otherwise. Moreover, phrases such as "connected to," "coupled to" or "in communication with" are not limited to direct connections unless expressly stated otherwise. Furthermore, words such as "top," "bottom," "upper," "lower," "left" or "right" are used merely to describe relative positions or orientations in the figures and do not require that any element in a device be positioned or oriented in a certain manner in its manufacturing or use. For example, a "bottom substrate" in a device may become a "top substrate" and vice versa if the device is turned upside down.

FIG. 1 is a cross-sectional view illustrating an example of a substrate/interposer assembly 100 with conductive posts protected by a dielectric. In FIG. 1, a substrate or interposer structure 104 is provided, and a plurality of conductive contacts (e.g. through substrate vias), including conductive contacts 106a, 106b, 106c and 106d, are implemented in the substrate or interposer structure 104 to provide electrical connections between opposite surfaces of the substrate or interposer structure 104 substrate or interposer structure 104. In an example, the substrate or interposer structure 104 may include a solder resist 102. Such a substrate/interposer assembly 100 may be manufactured in a conventional manner. In an example, a plurality of conductive posts 108a, 108b, 108c and 108d, such as copper posts, are coupled to the conductive contacts 106a, 106b, 106c and 106d in the substrate/interposer assembly 100, respectively. In an example, a dielectric 110 is provided that at least partially surrounds and protects the conductive posts 108a, 108b, 108c and 108d. In a further example, the dielectric 110 comprises a photoimageable dielectric (PID) material.

In the example shown in FIG. 1, the height $h_1$ of the dielectric 110 is slightly greater than the height $h_2$ of the conductive posts 108a, 108b, 108c and 108d, such that the conductive posts 108a, 108b, 108c and 108d are slight recessed within the surrounding dielectric 110. Moreover, in the example shown in FIG. 1, the dielectric 110 does not cover the entire area 112 of the substrate/interposer assembly 100 between the conductive posts 108b and 108c. Instead, some of the inner walls of the dielectric 110 leave open an interior space 112 for housing one or more integrated circuit dies (not shown in FIG. 1), which will be described in further detail below.

FIG. 2 is a cross-sectional view illustrating another example of a substrate/interposer assembly 100 with conductive posts 108a, 108b, 108c and 108d protected by a dielectric 110 in a manner similar to FIG. 1, except that a plurality of conductive pads 202a, 202b, 202c and 202d, such as copper pads, are added to the conductive posts 108a, 108b, 108c and 108d, respectively. Like FIG. 1, a plurality of conductive contacts, including conductive contacts 106a, 106b, 106c and 106d, are provided in the substrate/interposer assembly 100 in FIG. 2. Again, such a substrate/interposer assembly 100 may be manufactured in a conventional manner. A plurality of conductive posts 108a, 108b, 108c and 108d, such as copper posts, are coupled to the conductive contacts 106a, 106b, 106c and 106d in the substrate/interposer assembly 100, respectively. In an example, a dielectric 110 is provided that surrounds and protects the conductive posts 108a, 108b, 108c and 108d. In a further example, the dielectric 110 comprises a photoimageable dielectric (PID) material.

In the example shown in FIG. 2, the conductive pads 202a, 202b, 202c and 202d, such as copper pads, are directly coupled to the conductive posts 108a, 108b, 108c and 108d, such as copper posts, respectively. In an example, the conductive pads 202a, 202b, 202c and 202d may be manufactured as integral parts of the conductive posts 108a, 108b, 108c and 108d, respectively, which extend beyond the height $h_1$ of the dielectric 110. The conductive pads 202a-d may extend beyond the dielectric 110. As shown in FIG. 2, the height $h_1$ of the dielectric 110 is slightly less than the combined height $h_3$ of the conductive posts 108a, 108b, 108c and 108d and the conductive pads 202a, 202b, 202c and 202d. Moreover, similar to the example shown in FIG. 1, the dielectric 110 in the example shown in FIG. 2 also does not cover the entire area 112 of the substrate/interposer assembly 100 between the conductive posts 108b and 108c.

Instead, some of the inner walls of the dielectric 110 leave open an interior space 112 for housing one or more integrated circuit dies (not shown in FIG. 2), which will be described in further detail below.

FIG. 3 is a cross-sectional view illustrating an example of an integrated circuit package with conductive posts protected by a dielectric. In FIG. 3, a first (e.g. bottom) substrate/interposer assembly 302, an integrated circuit die 304 positioned over the first substrate/interposer assembly 302, and a second (e.g. top) substrate/interposer assembly 306. In the example shown in FIG. 3, a plurality of conductive posts 308a, 308b, 308c and 308d, such as copper posts, are in contact with conductive contacts 310a, 310b, 310c and 310d in the top substrate/interposer assembly 306, respectively. In an example, a dielectric 312, such as a PID, is provided that surrounds and protects each of the conductive posts 308a, 308b, 308c and 308d. In the example shown in FIG. 3, the combination of top substrate/interposer assembly 306, the conductive posts 308a, 308b, 308c and 308d, and the dielectric 312 protecting the conductive posts 308a, 308b, 308c and 308d is similar to the example of the assembly shown in FIG. 1 and described above.

In the example shown in FIG. 3, a plurality of solder balls 314a, 314b, 314c and 314d are provided on conductive contacts 316a, 316b, 316c and 316d of the bottom substrate/interposer assembly 302, respectively. In an example, the bottom substrate/interposer assembly 302 with the integrated circuit die 304 and the top substrate/interposer assembly 306 with the conductive posts 308a, 308b, 308c and 308d and the protective dielectric 312 may be manufactured separately before the conductive posts 308a, 308b, 308c and 308d are soldered to the conductive contacts 316a, 316b, 316c and 316d of the bottom substrate/interposer assembly 302 with solder balls 314a, 314b, 314c and 314d, respectively. In the example shown in FIG. 3, the bottom substrate/interposer assembly 302 may be regarded as a substrate of an integrated circuit package whereas the top substrate/interposer assembly 306 with its associated conductive posts 308a, 308b, 308c and 308d surrounded by a protective dielectric 312 may be regarded as an interposer of the package.

In FIG. 3, the conductive posts 308a, 308b, 308c and 308d, which are soldered to the conductive contacts 314a, 314b, 314c and 314d of the bottom substrate/interposer assembly 302, provide structural support as well as electrical connections between the bottom and top substrate/interposer assemblies 302 and 306. Moreover, in the example shown in FIG. 3, the integrated circuit die 304 is housed within an interior space between the bottom and top substrate/interposer assemblies 302 and 306 and the protective dielectric 312. The conductive posts 308a, 308b, 308c and 308d, such as copper posts, and the protective dielectric 312, such as PID, may be manufactured such that the copper posts have a relatively large aspect ratio, that is, the height-to-diameter ratio, thereby allowing for a sufficient interior space for the die 304. Although FIG. 3 illustrates an example in which solder balls are used to couple the conductive posts to respective conductive contacts on the substrate, other implementations of substrate/interposer assemblies with or without the use of solder balls may be devised within the scope of the disclosure.

Figure 4:
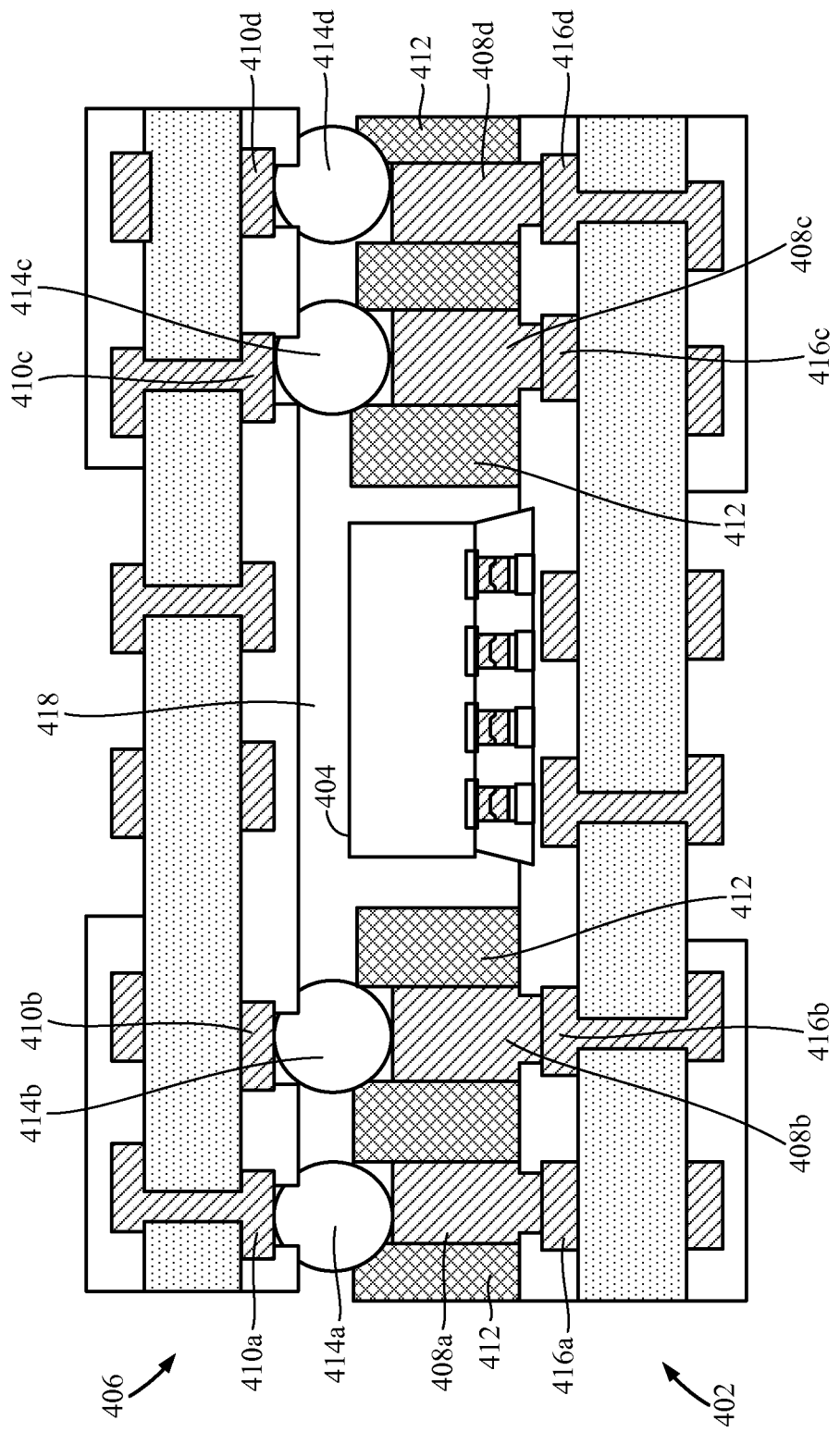
FIG. 4 is a cross-sectional view illustrating another example of an integrated circuit package similar to the example shown in FIG. 3, except that conductive posts are provided on conductive contacts of the bottom substrate/interposer assembly instead of the top substrate/interposer assembly.

FIG. 4 is a cross-sectional view illustrating another example of an integrated circuit package similar to the example shown in FIG. 3 and described above, except that conductive posts 408a, 408b, 408c and 408d are provided on conductive contacts 416a, 416b, 416c and 416d, respectively, of the bottom substrate/interposer assembly 402 instead of the top substrate/interposer assembly 406. In the example shown in FIG. 4, an integrated circuit die 404 is provided on the bottom substrate/interposer assembly 402 in the space between the dielectric 412 protecting the conductive posts 408b and 408c. The protective dielectric 412 may comprise a PID material, for example. In the example shown in FIG. 4, a plurality of solder balls 414a, 414b, 414c and 414d are provided on conductive contacts 410a, 410b, 410c and 410d of the top substrate/interposer assembly 406, respectively. The conductive posts 408a, 408b, 408c and 408d, such as copper posts, may be soldered to the conductive contacts 416a, 416b, 416c and 416d of the top substrate/interposer assembly 406 with solder balls 410a, 410b, 410c and 410d, respectively. After the bottom and top substrate/interposer assemblies 402 and 406 are assembled together, an interior space 418 is formed which houses the integrated circuit die 404.

Figure 5:
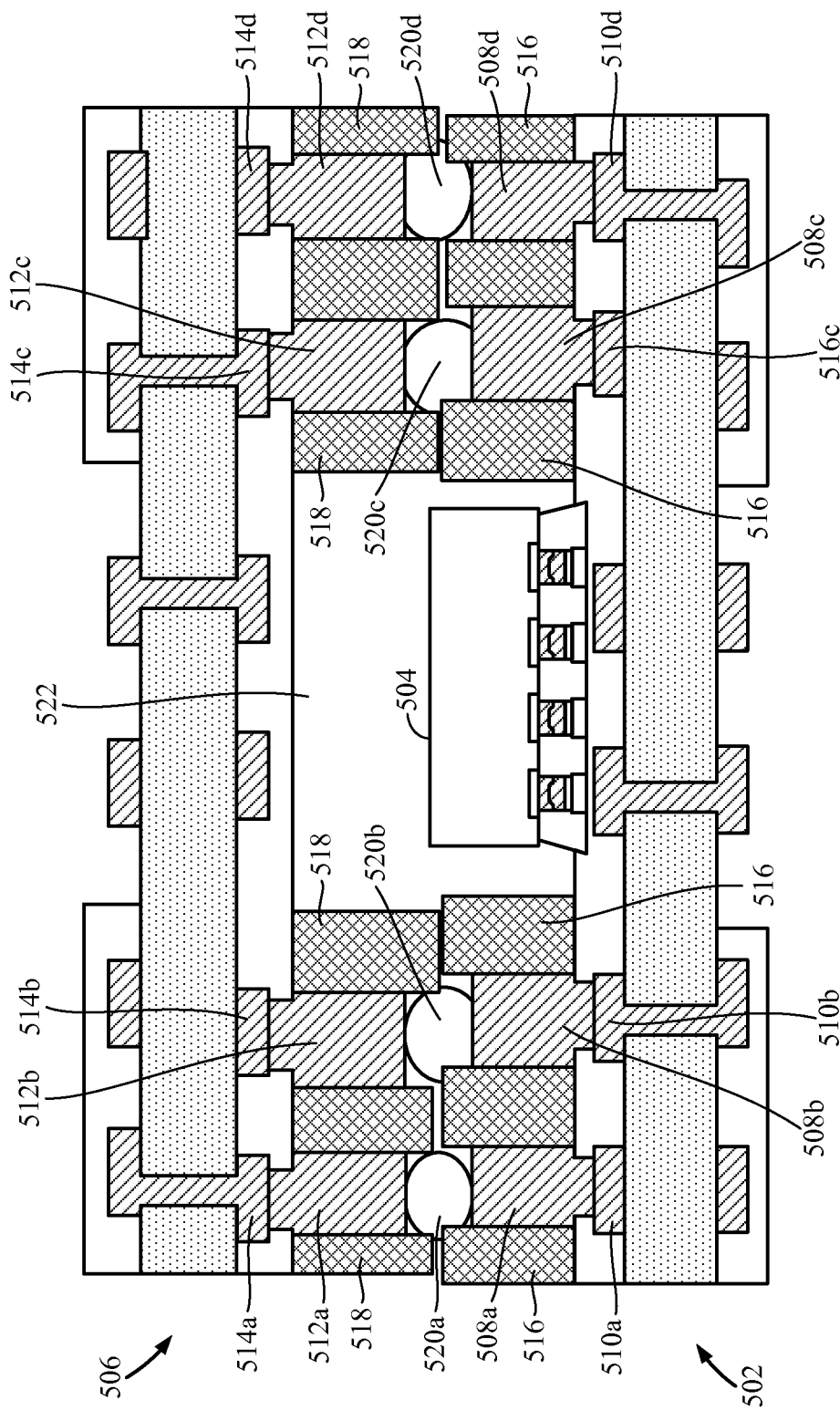
FIG. 5 is a cross-sectional view illustrating another example of an integrated circuit package in which the top and bottom substrate/interposer assemblies are each provided a separate set of conductive posts.

FIG. 5 is a cross-sectional view illustrating another example of an integrated circuit package in which the top and bottom substrate/interposer assemblies are each provided a separate set of conductive posts. In FIG. 5, an integrated circuit die 504 is attached to the bottom substrate/interposer assembly 502, and a top substrate/interposer assembly 506 is initially provided separately from the bottom substrate/interposer assembly 502. In an example, a first plurality of conductive posts 508a, 508b, 508c and 508d, such as copper posts, are provided on conductive contacts 510a, 510b, 510c and 510d of the bottom substrate/interposer assembly 502, respectively. In a similar manner, a second plurality of conductive posts 512a, 512b, 512c and 512d, such as copper posts, are provided on conductive contacts 514a, 514b, 514c and 514d of the top substrate/interposer assembly 506, respectively.

Moreover, a dielectric 516, such as a PID, surrounds and protects each of the first plurality of conductive posts 508a, 508b, 508c and 508d coupled to the bottom substrate/interposer assembly 502, whereas another dielectric 518, such as a PID, surrounds and protects each of the second plurality of conductive posts 512a, 512b, 512c and 512d coupled to the top substrate/interposer assembly 506. In an example, a plurality of solder balls 520a, 520b, 520c and 520d are provided to solder the first plurality of conductive posts 508a, 508b, 508c and 508d with the second plurality of conductive posts 512a, 512b, 512c and 512d, respectively. As shown in FIG. 5, an interior space 522 formed by the bottom substrate/interposer assembly 502, the top substrate/interpose assembly 506, the dielectric 516 protecting the first plurality of conductive posts 508a, 508b, 508c and 508d and the dielectric 518 protecting the second plurality of conductive posts 512a, 512b, 512c and 512d houses the integrated circuit die 504.

Figure 6:
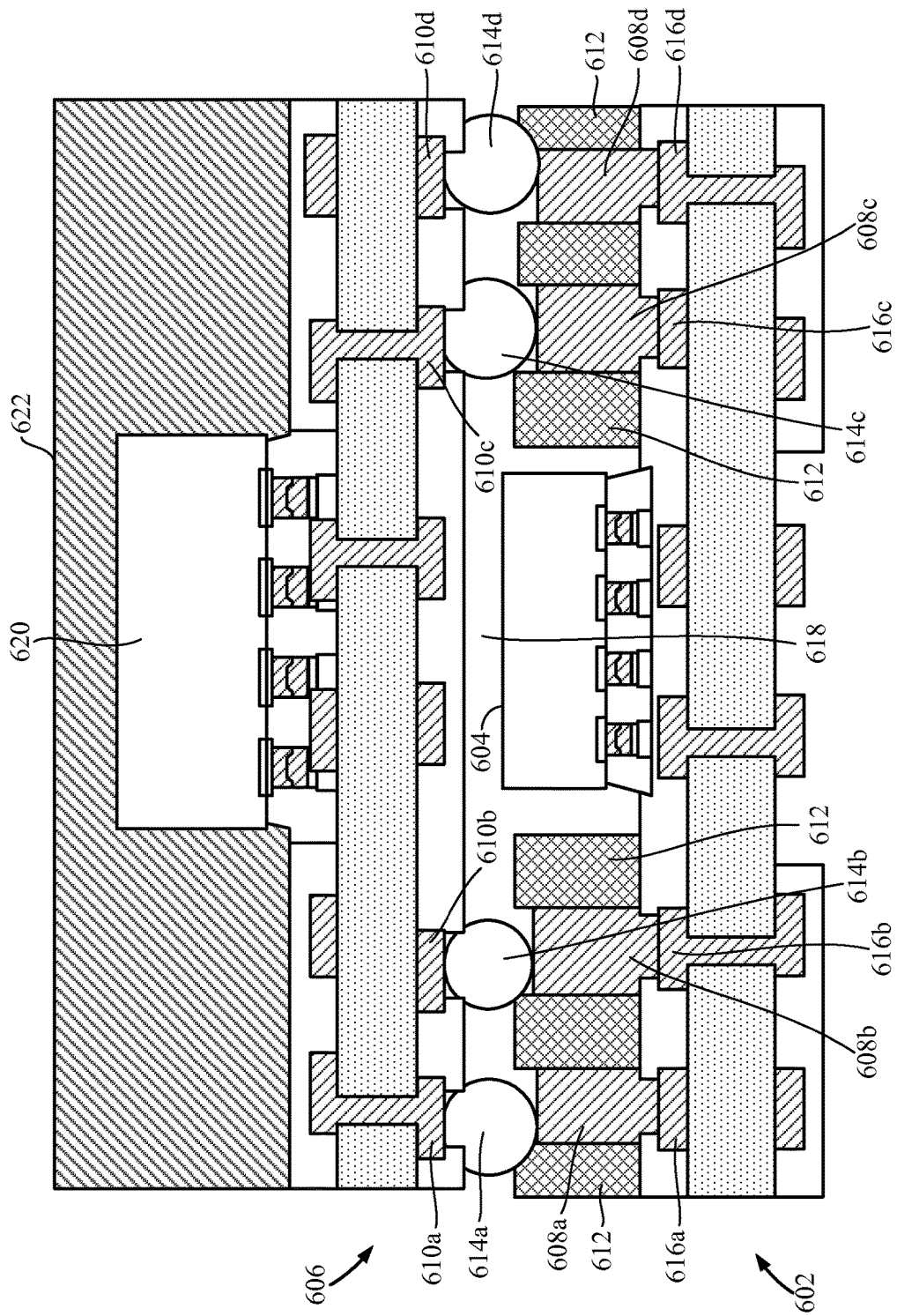
FIG. 6 is a cross-sectional view illustrating yet another example in which top and bottom substrate/interposer assemblies are provided in a package-on-package (POP) configuration.

FIG. 6 is a cross-sectional view illustrating yet another example in which top and bottom substrate/interposer assemblies are provided in a package-on-package (POP) configuration. In FIG. 6, a plurality of conductive posts 608a, 608b, 608c and 608d, such as copper posts, are provided on conductive contacts 616a, 616b, 616c and 616d, respectively, of the bottom substrate/interposer assembly 602, which also supports a first integrated circuit die 604. A dielectric 612, which in an example comprises a PID material, surrounds and protects each of the conductive posts 608a, 608b, 608c and 608d. A plurality of solder balls 614a, 614b, 614c and 614d are provided on conductive contacts 610a, 610b, 610c and 610d of the top substrate/interposer 606. An interior space 618 formed by the bottom and top substrate/interposer assemblies 602 and 606 and the dielectric 612 houses the first integrated circuit die 604. Before a second die is implemented to form a POP, the bottom and top substrate/interposer assemblies 602 and 606 with conductive posts 608a, 608b, 608c and 608d surrounded by the dielectric 612 for housing the first integrated circuit die 604 is similar to the configuration shown in FIG. 4 and described above.

In the example shown in FIG. 6, a second integrated circuit die 620 is formed on top of the top substrate/interposer assembly 606 outside the space 618 for housing the first integrated circuit die 604. In a further example, a mold or epoxy flux 622 may be provided over the second integrated circuit die 620 in a conventional manner to form a POP configuration as shown in FIG. 6. Alternatively, additional conductive posts, such as copper posts, and surrounding dielectric, such as PID, to protect the copper posts may be provided on top of the top substrate/interposer assembly 606 in a similar manner to the conductive posts 608a, 608b, 608c and 608d and surrounding dielectric 612 provided to the bottom substrate/interposer assembly 602. In yet a further example, one or more additional substrates or interposers may be provided above the second integrated circuit die 622 in a similar manner for stacking of one or additional dies in various POP configurations.

Figure 7A:
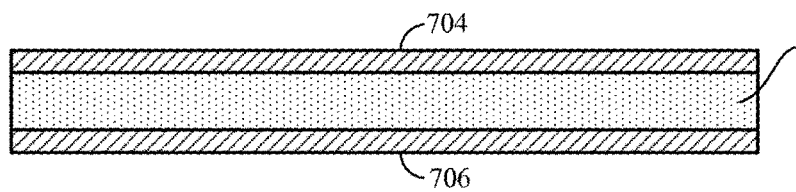
FIGS. 7A-7I are cross-sectional views illustrating an example of a process of making a structure with a substrate/interposer assembly and dielectric-protected conductive posts as shown in FIG. 1.
Figure 7B:
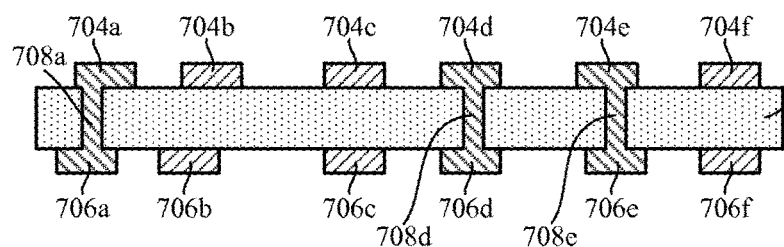

FIGS. 7A-7I are cross-sectional views illustrating an example of a process of making a structure with a substrate/interposer assembly and conductive posts protected by a dielectric as shown in FIG. 1 and described above. The process illustrated in FIGS. 7A-7I is merely one of many examples of processes for making the structure of FIG. 1. Referring to FIG. 7A, a core material 702 and top and bottom metal layers 704 and 706 on opposite surfaces of the core material 702 are initially provided in preparation for making an interposer. FIG. 7B illustrates the next stage of making an interposer after the top and bottom metal layers are patterned and vias are formed through the core material. In the example illustrated in FIG. 7B, the top metal layer 704 has been patterned and etched to form conductive contacts 704a, 704b, . . . 704f, whereas the bottom metal layer 706 has been patterned and etched to form conductive contacts 706a, 706b, . . . 706f.

Figure 7C:
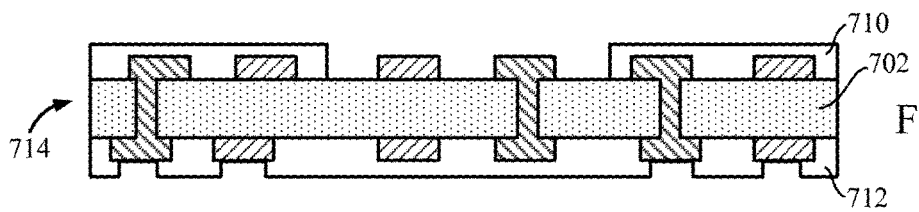

A plurality of vias 708a, 708d and 708e are provided through the core material 702. Conductors such as metals are provided in the vias 708a, 708d and 708e to form electrical connections between conductive contacts 704a and 706a, between conductive contacts 704d and 706d, and between 704e and 706e, respectively. In the example shown in FIG. 7B, some but not all of the conductive contacts in the top metal layer and corresponding conductive contacts in the bottom metal layer are electrically coupled through vias. FIG. 7C illustrates a substrate/interposer assembly 714 after substrate materials 710 and 712 are formed on the top and bottom surfaces of the core material 702. In an example, the substrate/interposer assembly 714 may be manufactured in a conventional manner up to the stage as shown in FIG. 7C.

Figure 7D:
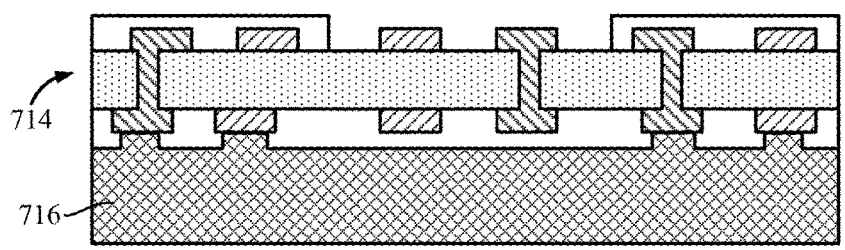
Figure 7E:
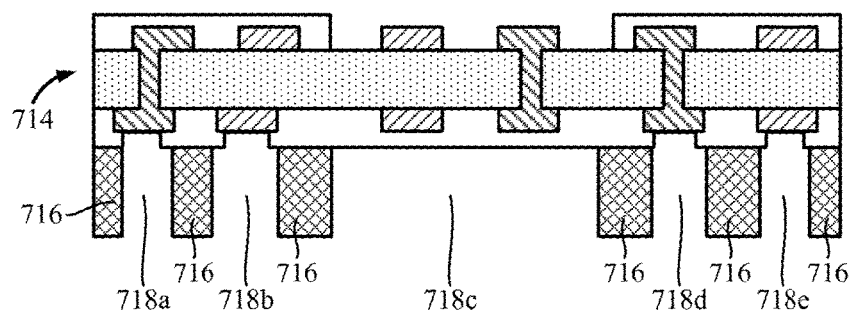

FIG. 7D is a cross-sectional view illustrating a dielectric coating 716 formed on the bottom of the substrate/interposer assembly. In an example, the dielectric coating 716 comprises a PID material. Among many types of dielectric materials that may be suitable for the protection of conductive posts such as copper posts, PID may be regarded as having advantages of relatively low material cost and ease of manufacturing. After the dielectric coating 716 is applied to the substrate/interposer assembly 714, portions of the dielectric coating 716 are removed to form openings 718a, 718b, . . . 718e, as illustrated in FIG. 7E. In the example shown in FIG. 7E, the openings 718a, 718b, 718d and 718e are spaces reserved for conductive posts, such as copper posts, whereas the center opening 718c is reserved as part of the interior space for housing an integrated circuit die.

Figure 7F:
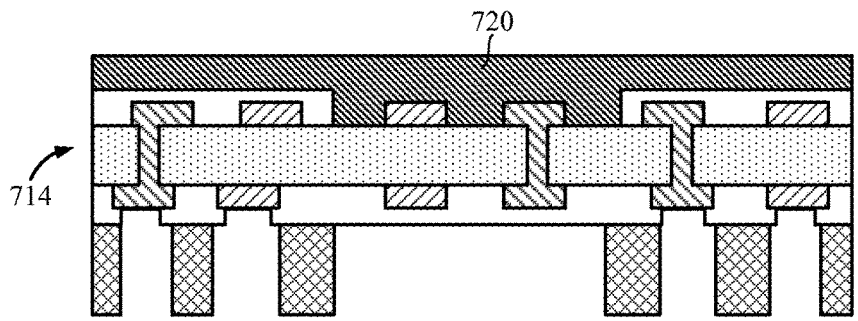
Figure 7G:
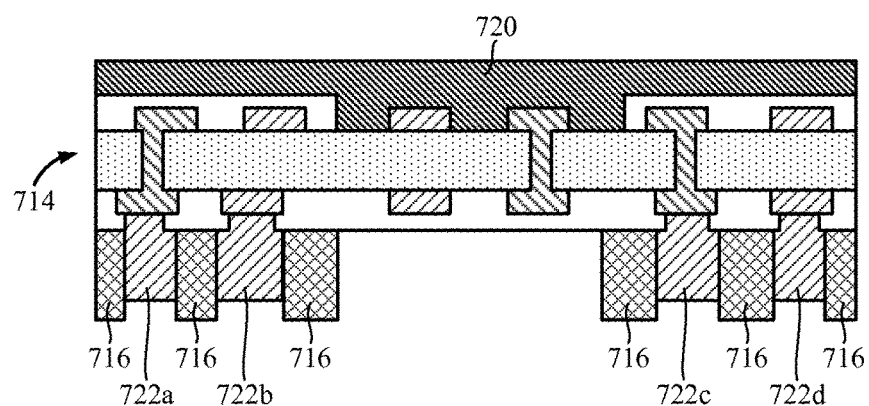
Figure 7H:
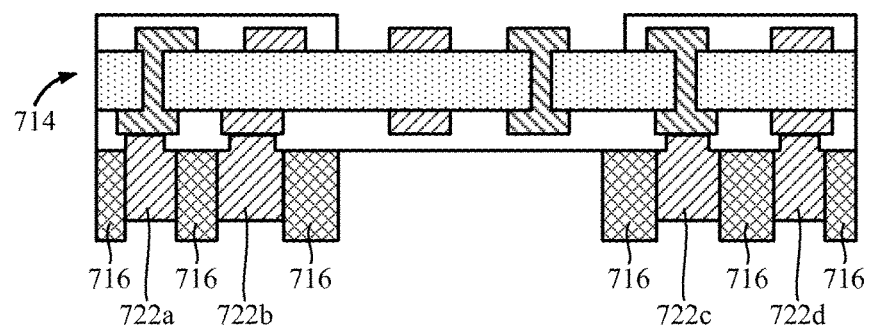
Figure 7I:
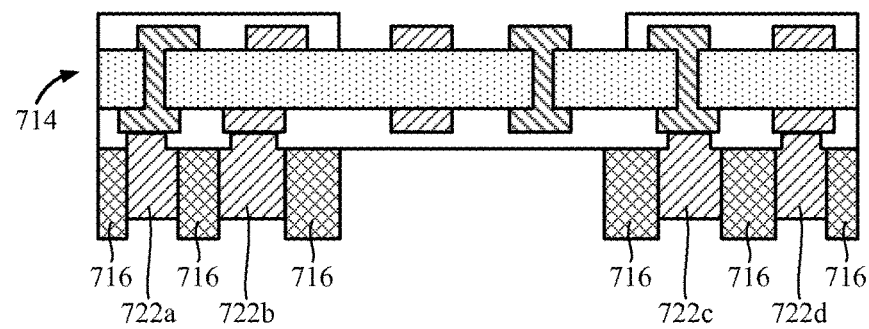

FIG. 7F is a cross-sectional view illustrating an example in which backside masking is applied to the substrate/interposer assembly 714. In FIG. 7F, a backside mask 720 is applied to the top of the substrate/interposer assembly 714. FIG. 7G is a cross-sectional view illustrating the plating of a metal, such as copper, to form conductive posts 722a, 722b, 722c and 722d, such as copper posts, within the openings 718a, 718b, 718d and 718e in the dielectric coating 716, respectively, as shown in FIG. 7E. As shown in FIG. 7G, the height of the conductive posts 722a, 722b, 722c and 722d are slightly less than the height of the dielectric coating 716, as illustrated in FIG. 1 and described above, such that the conductive posts 722a, 722b, 722c and 722d are slightly recessed within the dielectric coating 716. FIG. 7H is a cross-sectional view illustrating the substrate/interposer assembly after the backside mask has been stripped or removed. FIG. 7I is a cross-sectional view illustrating the substrate/interposer assembly after further processes, such as a surface finish process on the top of the substrate/interposer assembly 714, for example.

Figure 8A:
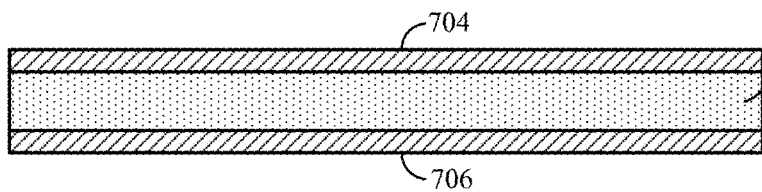
FIGS. 8A-8J are cross-sectional views illustrating an example of a process of making a structure with a substrate/interposer assembly and dielectric-protected conductive posts with associated conductive pads as shown in FIG. 2.
Figure 8B:
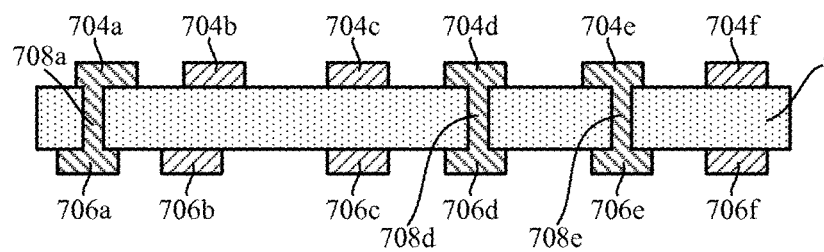

FIGS. 8A-8J are cross-sectional views illustrating an example of a process of making a structure with a substrate/interposer assembly and dielectric-protected conductive posts with associated conductive pads as shown in FIG. 2 and described above. The process illustrated in FIGS. 8A-8J is merely one of many examples of processes for making the structure of FIG. 2. Referring to FIG. 8A, a core material 702 and top and bottom metal layers 704 and 706 on opposite surfaces of the core material 702 are initially provided in preparation for making an interposer. FIG. 8B illustrates the next stage of making an interposer after the top and bottom metal layers are patterned and vias are formed through the core material. In the example illustrated in FIG. 7B, the top metal layer 704 has been patterned and etched to form conductive contacts 704a, 704b, . . . 704f, whereas the bottom metal layer 706 has been patterned and etched to form conductive contacts 706a, 706b, . . . 706f.

Figure 8C:
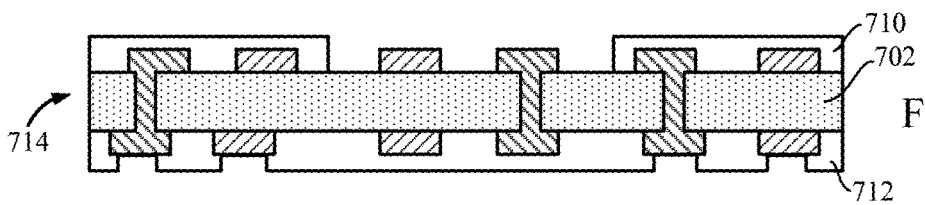

A plurality of vias 708a, 708d and 708e are provided through the core material 702. Conductors such as metals are provided in the vias 708a, 708d and 708e to form electrical connections between conductive contacts 704a and 706a, between conductive contacts 704d and 706d, and between 704e and 706e, respectively. In the example shown in FIG. 8B, some but not all of the conductive contacts in the top metal layer and corresponding conductive contacts in the bottom metal layer are electrically coupled through vias. FIG. 8C illustrates a substrate/interposer assembly 714 after substrate materials 710 and 712 are formed on the top and bottom surfaces of the core material 702. In the example shown in FIG. 8C, the substrate/interposer assembly 714 includes solder resists 710 and 712 and a substrate/interposer core 702.

Figure 8D:
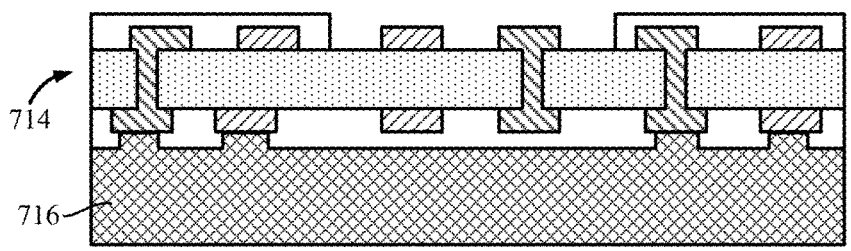
Figure 8E:
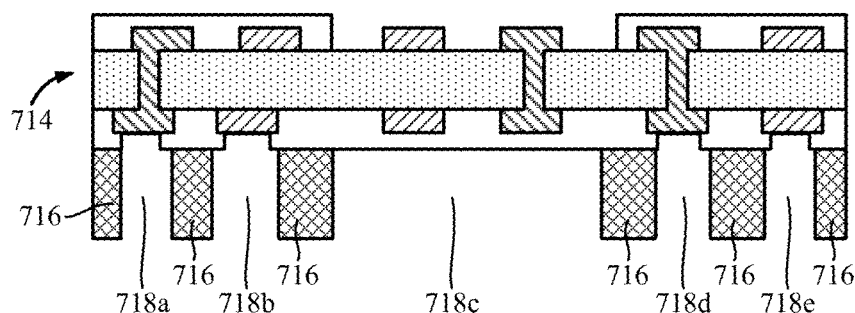

FIG. 8D is a cross-sectional view illustrating a dielectric coating 716 formed on the bottom of the substrate/interposer assembly. In an example, the dielectric coating 716 comprises a PID material. In an example, PID may be chosen as the material for the dielectric coating 716 because of its relatively low material cost and ease of manufacturing. Alternatively, another material such as phenolic resin, polyimide resin, acrylic resin, or polyhydroxystyrene may also be used as the material for the dielectric coating 716. After the dielectric coating 716 is applied to the substrate/interposer assembly 714, portions of the dielectric coating 716 are removed to form openings 718a, 718b, . . . 718e, as illustrated in FIG. 8E. In the example shown in FIG. 8E, the openings 718*a*, 718*b*, 718*d* and 718*e* are spaces reserved for conductive posts, such as copper posts, whereas the center opening 718*c* is reserved as part of the interior space for housing an integrated circuit die.

Figure 8F:
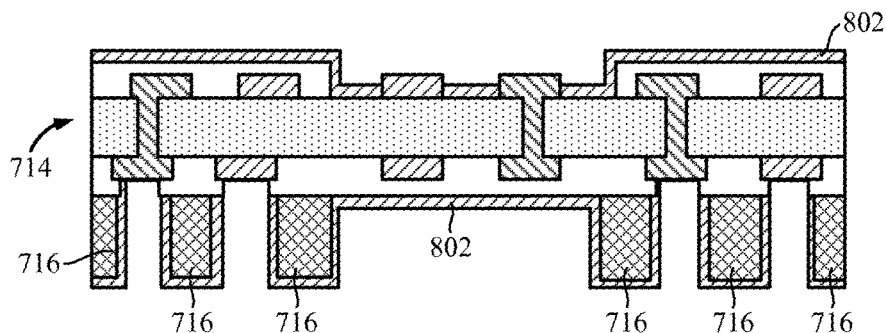
Figure 8G:
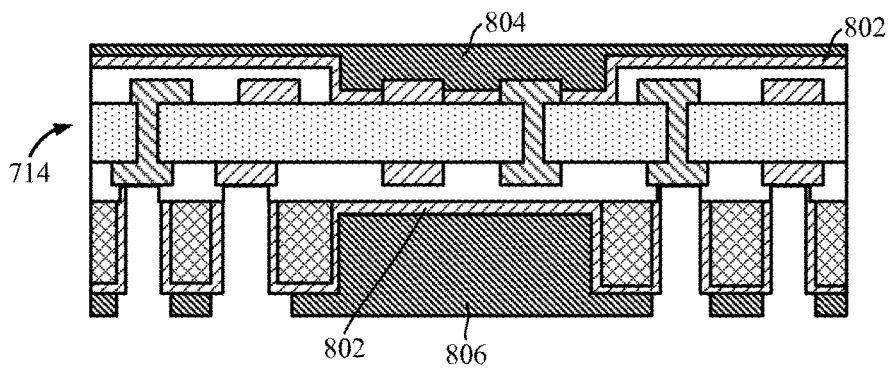
Figure 8H:
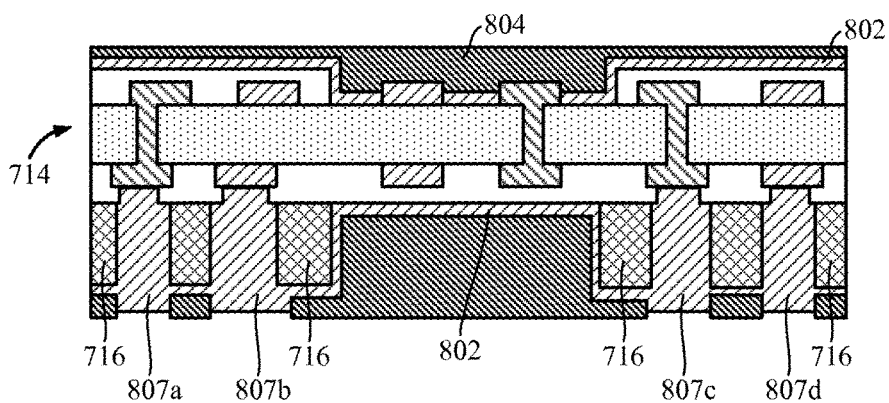

FIG. 8F is a cross-sectional view illustrating an example in which a seed layer 802 is coated on the top and bottom surfaces of the substrate/interposer assembly 714 and over the dielectric coating 716. FIG. 8G is a cross-sectional view illustrating an example in which backside masking is applied to the substrate/interposer assembly 714. In FIG. 8G, a backside mask 804 is applied over the seed layer 802 on top of the substrate/interposer assembly 714, and another mask 806 is also applied over the seed layer 802 on the bottom of the substrate/interposer assembly 714 and on the dielectric coating 716. FIG. 8H is a cross-sectional view illustrating the plating of a metal, such as copper, to form conductive posts 806*a*, 806*b*, 806*c* and 806*d*, such as copper posts, within the openings 718*a*, 718*b*, 718*d* and 718*e* in the dielectric coating 716, respectively, as shown in FIG. 8E. In FIG. 8H, metal plating is applied to form the conductive posts 806*a*, 806*b*, 806*c* and 806*d* while the masks 804 and 806 remain on the substrate/interposer assembly 714.

Figure 8I:
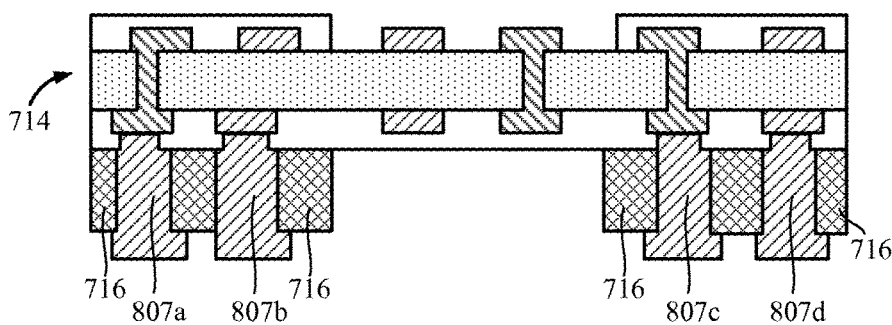
Figure 8J:
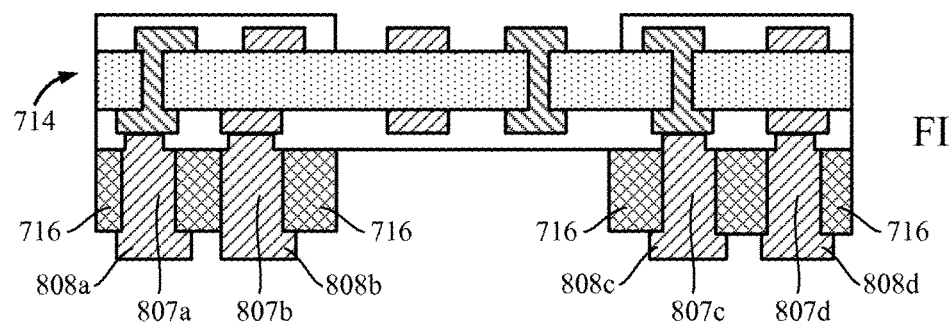

In the example shown in FIG. 8H, the height of the conductive posts 806*a*, 806*b*, 806*c* and 806*d* are slightly greater than the height of the dielectric coating 716, as illustrated in FIG. 2 and described above. In an example, after the conductive posts 806*a*, 806*b*, 806*c* and 806*d*, such as copper posts, are formed within the openings of the dielectric coating 716, the masks 804 and 806 above and below the substrate/interposer assembly 714 are stripped or removed, following by the removal of the seed layer 802. FIG. 8I is a cross-sectional view illustrating the substrate/interposer assembly after the masks 804 and 806 and the seed layer 802 have been removed. FIG. 8J is a cross-sectional view illustrating the substrate/interposer assembly after further processes, such as a surface finish process on the top of the substrate/interposer assembly 714, for example. In the example shown in FIG. 8J, the bottom portions 808*a*, 808*b*, 808*c* and 808*d* of the conductive posts 806*a*, 806*b*, 806*c* and 806*d*, respectively, extend beyond the dielectric coating 716 and serve as conductive pads for the respective conductive posts. In this example, the conductive pads are formed as integral extensions of respective conductive posts protected by the dielectric coating. Alternatively, conductive pads extending beyond the dielectric coating may be formed over respective conductive pads in separate processes.

While the foregoing disclosure shows illustrative examples, it should be noted that various changes and modifications could be made herein without departing from the scope of the appended claims. The functions or actions of the method claims in accordance with examples described herein need not be performed in any particular order unless expressly stated otherwise. Furthermore, although elements may be described or claimed in the singular, the plural is contemplated unless limitation to the singular is explicitly stated.

What is claimed is:

1. A device, comprising:
   a first substrate comprising first and second surfaces;
   a plurality of conductive contacts on the first surface of the first substrate;
   a dielectric on the first surface of the first substrate and having a plurality of openings; and
   a plurality of conductive posts coupled to at least some of the plurality of conductive contacts,
   wherein the dielectric at least partially surrounds the plurality of conductive posts,
   wherein the plurality of conductive contacts are in contact with and protrude beyond the first surface of the first substrate, and
   wherein at least one of the plurality of conductive contacts extends through the first substrate so as to be in contact with and protrude beyond the second surface of the first substrate.

2. The device of claim 1, wherein the first substrate comprises a first interposer.

3. The device of claim 1, wherein the dielectric comprises a photoimageable dielectric (PID).

4. The device of claim 1, wherein the plurality of conductive posts comprise a plurality of copper posts.

5. The device of claim 1, further comprising a plurality of conductive pads coupled to the plurality of conductive posts, respectively.

6. The device of claim 5, wherein the plurality of conductive pads comprise a plurality of copper pads.

7. The device of claim 1,
   wherein the plurality of conductive contacts are a first plurality of conductive contacts, and
   wherein the device further comprises:
   a second substrate comprising first and second surfaces; and
   a second plurality of conductive contacts on the first surface of the second substrate.

8. The device of claim 7, wherein the second substrate comprises a second interposer.

9. The device of claim 7, wherein the plurality of conductive posts are electrically coupled to at least some of the second plurality of conductive contacts.

10. The device of claim 9, further comprising a plurality of solder balls coupled between the plurality of conductive posts and the at least some of the second plurality of conductive contacts, respectively.

11. The device of claim 7, further comprising an integrated circuit die within an opening in the dielectric.

12. The device of claim 11, wherein the integrated circuit die is disposed on the first surface of the second substrate.

13. The device of claim 12,
   wherein the integrated circuit die is a first the integrated circuit die, and
   wherein the device further comprises a second integrated circuit die disposed on the second surface of the second substrate.

14. The device of claim 13, further comprising a mold on the second surface of the first substrate and the second integrated circuit die.

15. An integrated circuit package, comprising:
   a first substrate having first and second surfaces;
   a first plurality of conductive contacts on the first surface of the first substrate;
   a second substrate having first and second surfaces;
   a second plurality of conductive contacts on the first surface of the second substrate;
   a dielectric disposed between the first surface of the first substrate and the first surface of the second substrate, the dielectric having a plurality of openings;
   a plurality of conductive posts disposed within some but not all of the openings in the dielectric, the plurality of conductive posts electrically coupled to at least some of the first plurality of conductive contacts on the first surface of the first substrate and at least some of the second plurality of conductive contacts on the first surface of the second substrate; and an integrated circuit die disposed on the first surface of the second substrate within one of the openings of the dielectric not occupied by one of the plurality of conductive posts, wherein the plurality of conductive contacts are in contact with and protrude beyond the first surface of the first substrate, and wherein at least one of the plurality of conductive contacts extends through the first substrate so as to be in contact with and protrude beyond the second surface of the first substrate.

16. The integrated circuit package of claim 15, wherein the first substrate comprises a first interposer, and wherein the second substrate comprises a second interposer.

17. The integrated circuit package of claim 15, wherein the dielectric comprises a photoimageable dielectric (PID).

18. The integrated circuit package of claim 15, wherein the plurality of conductive posts comprise a plurality of copper posts.

19. The integrated circuit package of claim 15, further comprising a plurality of conductive pads coupled to the plurality of conductive posts, respectively.

20. The integrated circuit package of claim 19, wherein the plurality of conductive pads comprise a plurality of copper pads.

21. The integrated circuit package of claim 15, further comprising a plurality of solder balls coupled between the plurality of conductive posts and the at least some of the second plurality of conductive contacts on the first surface of the second substrate, respectively.

22. The integrated circuit package of claim 15, wherein the integrated circuit die is a first the integrated circuit die, and wherein the integrated circuit package further comprises a second integrated circuit die disposed on the second surface of the first substrate.

23. The integrated circuit package of claim 22, further comprising a mold on the second surface of the first substrate and the second integrated circuit die.

24. The device of claim 5, wherein a combined height of the plurality of conductive posts and the plurality of conductive pads extend beyond a height of the dielectric.

25. The integrated circuit package of claim 19, wherein a combined height of the plurality of conductive posts and the plurality of conductive pads extend beyond a height of the dielectric.

26. The integrated circuit package of claim 15, further comprising a plurality of solder balls coupled between the plurality of conductive posts and the at least some of the first plurality of conductive contacts on the first surface of the first substrate, respectively.

* * * * *